United States Patent [19]

Domenicali

[11] Patent Number: 5,204,739
[45] Date of Patent: Apr. 20, 1993

[54] PROXIMITY MASK ALIGNMENT USING A STORED VIDEO IMAGE

[75] Inventor: Peter L. Domenicali, Montpelier, Vt.

[73] Assignee: Karl Suss America, Inc., Waterbury Center, Vt.

[21] Appl. No.: 832,413

[22] Filed: Feb. 7, 1992

[51] Int. Cl.$^5$ .............................................. H04N 7/18
[52] U.S. Cl. ..................................... 358/93; 358/106; 358/107; 358/101; 358/227
[58] Field of Search ................. 358/93, 101, 106, 107, 358/227

[56] References Cited

U.S. PATENT DOCUMENTS

| | | | |
|---|---|---|---|
| 3,883,689 | 5/1975 | Mansour | 358/93 |
| 4,045,772 | 8/1977 | Bouton | 358/107 |
| 4,282,548 | 8/1981 | Plummer | 358/107 |
| 4,829,374 | 5/1989 | Miyamoto | 358/93 |
| 4,851,903 | 7/1989 | Ikeda | 358/107 |
| 4,929,893 | 5/1990 | Sato | 358/101 |
| 4,938,600 | 7/1990 | Into | 358/101 |

*Primary Examiner*—Howard W. Britton
*Attorney, Agent, or Firm*—Perman & Green

[57] ABSTRACT

A proximity mask alignment system includes a remotely-focusing microscope and a video frame storage device. When a first surface, such as an integrated circuit substrate, is in focus an image of the first surface is obtained and stored. Then, after the microscope is refocused to a second surface, such as a photomask, the stored image of the first surface is superimposed onto the "live" image of the second surface. The two focal positions are stored, with a selected one being normally provided to the microscope. A user initiates an automatic sequence wherein the microscope focuses to the other focal position, stores an image obtained at the other focal position, then refocuses to the original focal position. The stored image is superimposed on the image currently being generated, enabling the user to simultaneous view each surface in sharp focus, facilitating the alignment of the two surfaces to one another.

23 Claims, 3 Drawing Sheets

PROXIMITY MASK ALIGNMENT USING A STORED VIDEO IMAGE

FIELD OF THE INVENTION

This invention relates generally to imaging methods and apparatus and, in particular, to methods and apparatus using video images and having particular utility in semiconductor processing applications.

BACKGROUND OF THE INVENTION

In semiconductor microlithography a critical operation is the alignment of patterns on a photomask to previously-printed images on a circuit substrate, such as a substrate of silicon, ceramic, or other material. This alignment is typically made to a tolerance approaching, and often exceeding, one micrometer ($10^{-6}$ meters). In general, two images are observed using a microscope, and either the photomask or the substrate is manipulated into alignment with the other.

One problem that arises for the case of proximity lithography is that the photomask and the substrate must not be in contact with each other during alignment. If contact were made, the relative sliding motion between the photomask and the substrate could damage the very fine geometric features.

More particularly, due to an inter-surface gap which must be maintained during alignment, the features to be observed on the photomask and those on the substrate cannot both be simultaneously in sharp focus under the microscope. As a result, this often requires the use of a lower-magnification microscope objective, having a desired higher depth-of-field, than is optimum for the alignment tolerances sought.

Several techniques for solving this problem are known to the inventor, and include the following.

A first technique simply accepts the poorer alignment accuracy resulting from the use of the lower-magnification microscope objective, and adjusts the circuit design and fabrication process to accommodate the resulting overlay errors.

A second technique employs a revolving-turret nosepiece on the microscope and installs both a high-magnification, low depth-of-field objective and a low-magnification, high depth-of-field objective. The latter objective is used during alignment; then, just prior to the exposure, when the gap between the photomask and the substrate is typically reduced to contact (or near-contact) to achieve the best possible printing fidelity, the former objective is employed to check the alignment. If an alignment error is detected, the gap is increased again to the alignment condition, and the process is repeated. This process is often repeated many times, and may require in excess of 30 minutes to achieve the desired overlay accuracy. A further disadvantage of this technique is that each time the substrate is brought into contact with the photomask, there exists the potential to cause damage to either the substrate or the photomask.

A third technique employs an automatic alignment system, which might be one of two types. A first type is coherent-illumination based, and requires the use of a laser to detect and locate features with high accuracy over a large depth-of-field. A second type is image processing based and uses a video frame grabber and image processing computer to identify and accurately locate the target images on the photomask and substrate. This system requires a microscope which is capable of quickly and accurately auto-focusing under computer control. Systems embodying one or more of these features are known as an AL2000 and an ALX, both of which are manufactured by Karl Suss America, Inc. of Waterbury Center, Vt.

It is an object of this invention to provide a method and apparatus to accurately bring two planar surfaces into a predetermined spatial relationship with one another.

It is a further object of this invention to provide a method and apparatus for accurately and quickly aligning a photomask to a surface of a substrate.

SUMMARY OF THE INVENTION

The foregoing and other problems are overcome and the objects of the invention are realized by the use of a remotely-focusing microscope and a video frame storage device, referred to herein as a frame grabber. In accordance with the invention, when a first surface is in focus an image of the first surface is obtained and stored. Then, after the microscope is re-focused to a second surface, the stored image of the first surface is superimposed onto the "live" image of the second surface and displayed to an operator of the system. While viewing the two images, the operator is enabled to manually align the two surfaces one to another.

The use of the invention provides several advantages. A first advantage enables, relative to the conventional techniques described above, higher magnification objectives to be used, allowing alignment with better overlay accuracy. A second advantage eliminates the conventional practice of cycling between different objectives, thereby achieving alignment in a shorter period of time and increasing throughput. A third advantage eliminates the conventional requirement to cycle between the alignment gap condition and the exposure condition, thus reducing or eliminating the possibility of damage occurring to the photomask and/or the substrate, while also increasing throughput.

To fulfill the objects of the invention a video frame memory is employed to store and superimpose the images of two surfaces which are in different focal planes, for the purpose of aligning the two images laterally. The invention also employs a remotely-focusing video microscope, in conjunction with the use of a video frame memory, to store and superimpose the images of two surfaces which are in different focal planes, for the purpose of aligning the two images laterally.

More specifically, the invention teaches imaging apparatus, and a method for operating the apparatus. The apparatus includes an imaging system for generating and for storing image data, the imaging system including a microscope having a focal position that is adjustable between at least a first focal position and a second focal position. Coupled to the microscope is apparatus for use by an operator of the system for specifying a location of the first focal position and for specifying a location of the second focal position. The specifying apparatus outputs to the microscope, at any given time, either a specification of the location of the first focal position or a specification of the location of the second focal position. Also included is a control system, that is responsive to an input from the operator of the system, for causing the specifying apparatus to change, for a predetermined interval of time, from specifying the location of one of the first or the second focal positions to specifying the location of the other one of said focal positions. The control system also causes the imaging system to store, during the predetermined interval of time, image data generated at the location of the other one of the focal positions, and further causes the imaging system to superimpose, after an expiration of the predetermined interval of time, the stored image data upon image data being generated at the originally specified one of the first or the second focal positions. A display monitor is provided for displaying to the user of the system the stored image data superimposed upon the image data being generated at the originally specified one of the first or the second focal positions.

The microscope, in a presently preferred embodiment of the invention, is a splitfield microscope having a first microscope objective and a second microscope objective. The specifying apparatus specifies the location of the first focal position and the location of the second focal position separately for each of the microscope objectives.

During use, a substrate is positioned at the location of the first focal position, a photomask is positioned at the location of the second focal position, and the system further includes a translation stage for laterally positioning the substrate with respect to the photomask.

Alternatively, the system includes a translation stage for laterally positioning the photomask with respect to the substrate. The choice of which structure (photomask or substrate) to position is a function of the particular mask aligner, and is not germane to operation of the invention.

The imaging system also includes circuitry for compensating for a delay in reading out the stored image data so as to synchronize pixels of the stored image with pixels of the image data being generated at the originally specified one of the first or the second focal positions.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
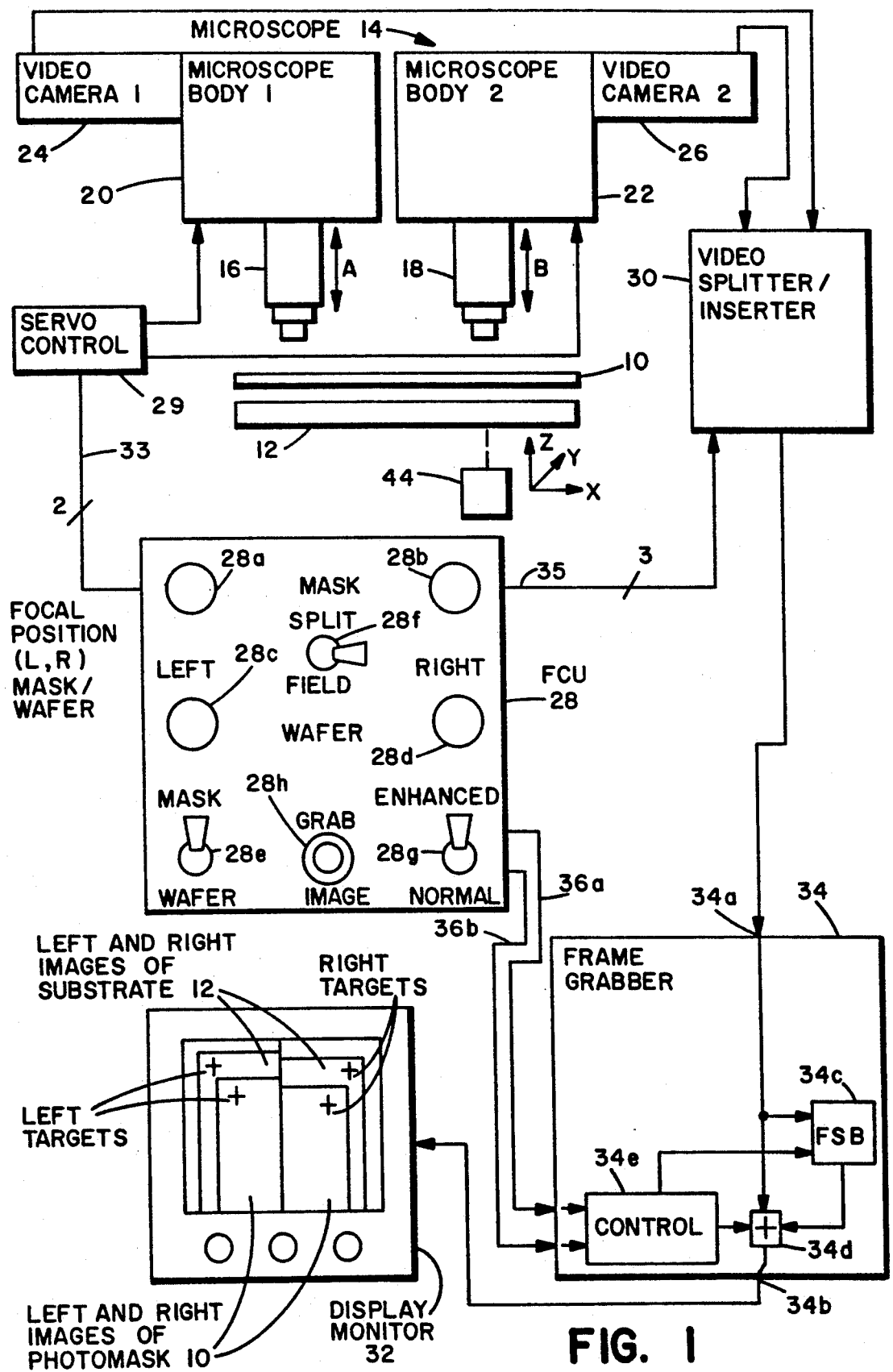
FIG. 1 is a block diagram of a proximity mask alignment system.

FIG. 1 illustrates a system 1 for aligning a photomask 10 and a substrate 12 in a proximity semiconductor lithography tool. The photomask 10 is typically 0.060 to 0.120 inch thick and is positioned on top of the substrate 12, which may be silicon, ceramic, metal, or any other suitable material. The photomask 10 includes a transparent substrate material that enables the wafer substrate 12 to be viewed through the photomask 10. Suspended stiffly above the photomask 10 is a dual video microscope 14 that includes two objective lenses 16 and 18, two microscope bodies 20 and 22, and two closed-circuit television (video) cameras 24 and 26. The microscope 14 includes a capability of being focused remotely. By example, DC servo motors (not shown) within the microscope bodies 20 and 22 drive the objectives 16 and 18, through eccentric cranks, in the manner depicted by arrows A and B. One presently preferred embodiment for the microscope 14 is known as a Model No. DVM6, manufactured by Karl Suss America, Inc, of Waterbury Center, Vt. Analog command signals 33 for the left and right servo motors originate from a focus control unit (FCU) 28. The command signals 33 are input to a servo controller 29 which outputs servo motor drive signals to the microscope bodies 20 and 22.

FCU 28 includes four potentiometers (28a–28d) which are manually set by an operator of the system 1 to establish the focus positions of the left and right objectives 16 and 18. Two potentiometers relate to each objective, with one pair (28a, 28b) dedicated to the photomask (MASK) focal position and one pair (28c, 28d) dedicated to the substrate (WAFER) focal position. The two pairs of potentiometers are selected using a MASK/WAFER toggle switch 28e. This configuration enables presetting the focal positions for the photomask and substrate, with potentiometers 28a–28d, and further enables switching back and forth, with switch 28e, between the two focal positions without requiring an operator to carefully readjust the focus potentiometers 28a–28d. As such, the potentiometers 28a–28d maintain an electrical record of the desired focus positions.

Video output signals from the two video cameras 24 and 26 are applied to a conventional video splitter/inserter (VSI) 30. VSI 30 functions to insert a portion of the image from the right video camera 26 into the image from the left video camera 24, so that a split image, having a left subimage and a right subimage, is visible on a display monitor 32. A toggle switch 28f on the FCU 28 provides an output signal 35 to the VSI 30 for selecting whether the monitor 32 displays the split-field image, or displays only the left camera 24 or the right camera 26 output.

The video output signal from the VSI 30 is applied to an input 34a of a frame grabber circuit (FGC) 34 which is designed to pass the video signal directly through to an output 34b at all times. The output of the FGC 34 is applied to the video display monitor 32 for display. The operation of the VFG 34 is controlled by a controller 34e in response to signals appearing on two signal lines from the FCU 28. A first signal line 36a is a two-state line which is toggled by an ENHANCED/NORMAL switch 28g. This line controls, when the switch 28g is placed into the ENHANCED position, the output from a frame storage buffer (FSB) 34c of the FGC 34 to be added, via adder block 34d, to the passed-through live video signal from the VSI 30, thereby superimposing the stored image onto the live image. A second line 36b conveys a pulsed signal that is generated by the FCU 28 when a GRAB IMAGE switch 28h is depressed. The effect of the pulsed signal is to cause the FGC 34 to "grab" (digitize) a frame of the live video signal and to store the digitized video frame into the FSB 34c.

Preferably, the adder 34d adds the analog "live" video signal to the output of the FSB 34c after the output of the FSB 34c has been converted from digital to analog form. So as to eliminate any image offsets due to a phase delay introduced by the operation of reading out the FSB 34c and converting the digital pixel data to analog form, the controller 34e introduces a phase advance into the output of the FSB 34c. One method of producing the phase advance is to initiate reading the stored pixels of a scan line prior to the beginning of the scan line sweep. As a result, the first pixel is read out, converted to analog form, and is synchronized with the first scan line pixel of the "live" image. The goal is to experience a maximum phase error at the display monitor 32 of less than one quarter (25%) of a pixel width. As can be appreciated, for an alignment system of the type shown it is important that any displayed offsets between the two images be due to a physical, lateral offset between the photomask 10 and the substrate 12, and not due to artifacts introduced by the imaging system.

Figure 2:
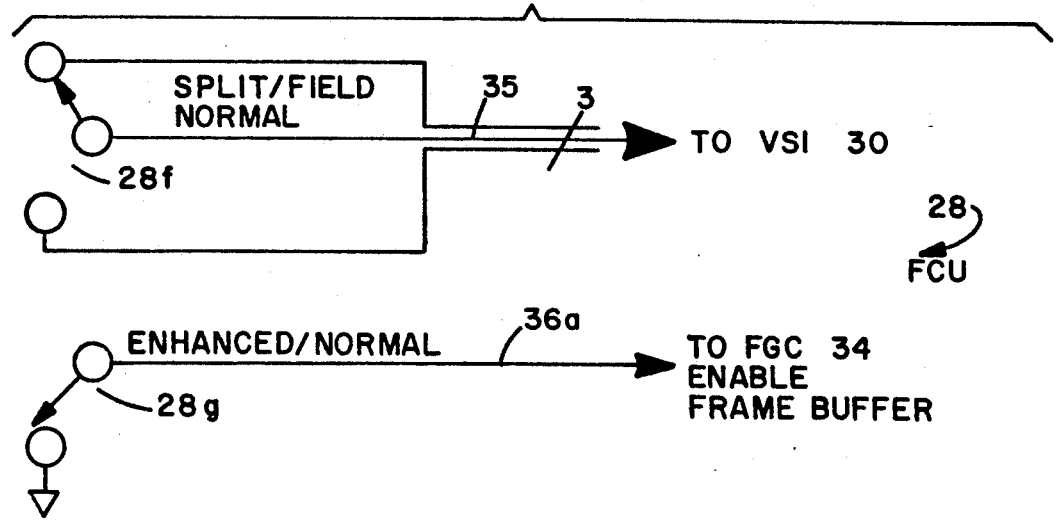
FIG. 2 is a schematic diagram showing in greater detail a focus control unit.
Figure 2:
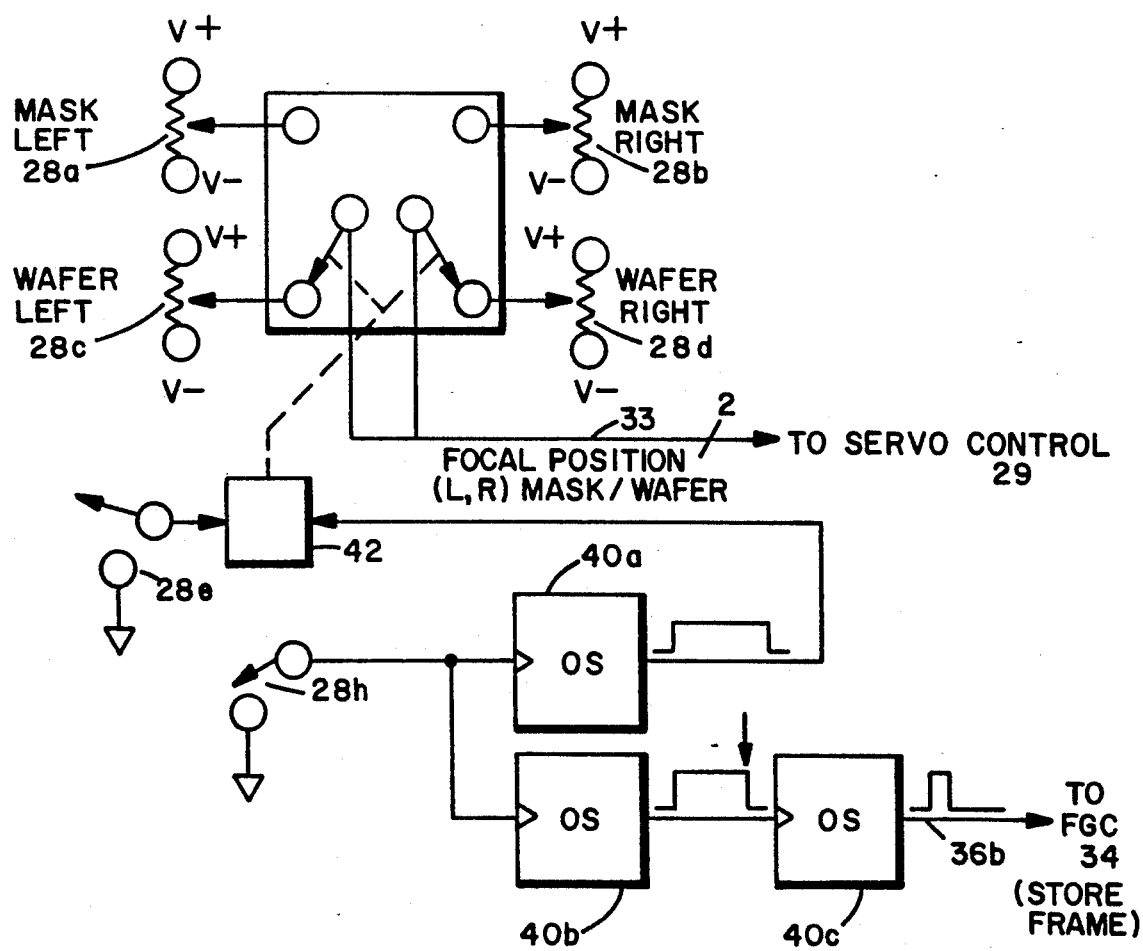

Referring to FIG. 2 there is shown a presently preferred construction of the FCU 28. The FCU 28 includes three pulse sources, implemented by way of example but not by limitation, as one-shot (OS) monostable multivibrators (40a, 40b, 40c). Reference is also made to the flowchart of FIG. 3 for the discussion of the operation of the circuitry of the FCU 28.

When the "GRAB IMAGE" pushbutton switch 28h is pressed, OSs 40a and 40b are set and commence their time-out periods. OS 40a is configured to generate a pulse having a pulse width that is longer than the pulse width of OS 40b. For a presently preferred embodiment OS 40a generates a one second pulse and OS 40b generates a 0.7 second pulse. The maximum duration of each of these two pulse widths is application dependent, and is a function of the operating characteristics of the microscope 14, as will be described.

OS 40c is configured as a 100-microsecond pulse generator. The output of OS 40c is coupled to signal line 36b and signals the FGC 34 to digitize and store, or "grab", an image.

The output of OS 40a controls logic circuitry 42 to override the manual setting of MASK/WAFER switch 28e so as to toggle the focus controls between the MASK and WAFER focus positions as set by the respective potentiometers (28a-28d). The actual switching is performed, by example, by a digitally-controlled solid-state analog switch 43.

The result is that if the MASK focus has been initially selected, upon activating the GRAB IMAGE switch 28h the microscope 14 drives the objectives 16 and 18 to the preset WAFER focus position for one second, the pulse duration of the output of OS 40a. After one second, circuit 42 places the analog switch 43 back to the original state, and the microscope 14 then reverts to the MASK focus position. If instead the WAFER focus has been initially selected, upon activating the GRAB IMAGE switch 28h the microscope 14 drives the objectives 16 and 18 to the preset MASK focus position for one second, the pulse duration of the output of OS 40a. After one second, circuit 42 places the analog switch 43 back to the original state, and the microscope 14 then reverts to the WAFER focus position.

The 0.7 second pulse output by OS 40b is coupled to the trigger input of OS 40c and functions to trigger OS 40c at the termination of the 0.7 second pulse. As a result, OS 40c generates the 100 microsecond pulse 0.7 seconds after the initiation of the one second pulse by OS 40a. The 0.7 second delay in generating the 100 microsecond pulse to the FGC 34 ensures that the microscope 14 has sufficient time to arrive at the new focus position and to settle out any mechanical vibrations which may be caused by driving the objectives 16 and 18 to the desired preset focus positions. As such, it can be realized that the various pulse widths disclosed herein are functions of the microscope 14 and FGC 34 operating characteristics.

Figure 3:
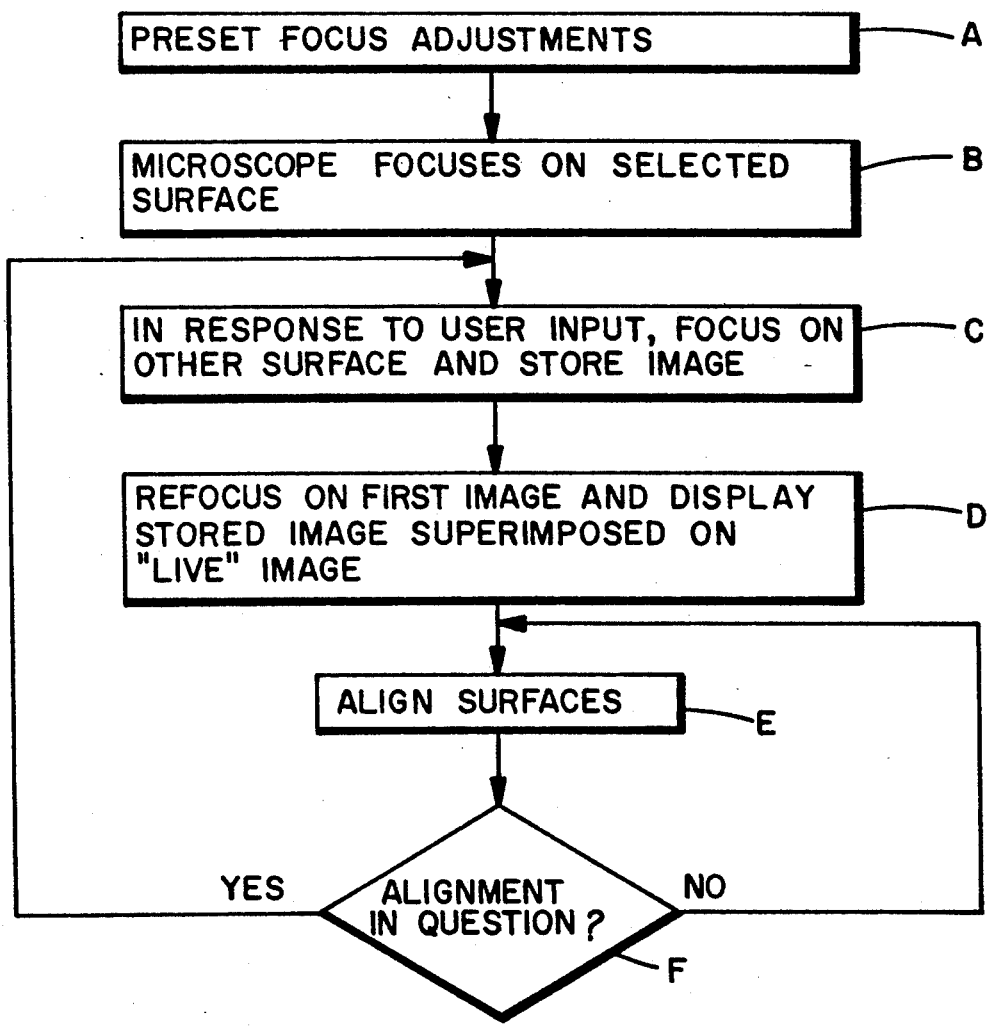
FIG. 3 is a flow chart illustrating the steps of a method of the invention.

To summarize the operation of the system 1, and in accordance with the flow chart of FIG. 3, the following steps are executed.

(STEP A) The four potentiometers 28a-28d are suitably adjusted so that when the MASK/WAFER switch 28e is in the MASK position the photomask 10 is in sharp focus, and when the switch 28e is in the WAFER position the substrate 12 is in sharp focus. The separation between the lower surface of the photomask 10 and the top surface of the substrate 12, during the alignment process, is typically on the order of 100 micrometers.

(STEP B) The MASK/WAFER switch 28e is left in the position corresponding to whichever surface is movable during the alignment operation. Normally either the photomask 10 or the substrate 12 is moveable, but not both. As a result, the microscope 14 drives the objectives 16 and 18 to focus on the movable surface selected by the MASK/WAFER switch 28e, and an image of the movable surface is displayed upon the display monitor 32. The ENHANCED/NORMAL switch 28g is placed in the ENHANCED position to enable the frame storage buffer output to be superimposed upon the live video signal.

(STEP C) The GRAB IMAGE switch 28h is activated. This causes the microscope 14 to drive the objectives 16 and 18 to the opposite preset focal position that corresponds to the normally non-movable surface (photomask or substrate, depending upon the particular architecture of the alignment system 1). A predetermined time after the GRAB IMAGE switch 28h is activated, the 100 microsecond pulse appears on signal line 36b, causing the FGC 34 to digitize and store within the FSB 34c the image being received from the non-movable surface.

(STEP D) After OS 40a times out, the microscope 14 drives the objectives 16 and 18 so as to once more focus upon the movable surface, as indicated by the manually set position of the MASK/WAFER switch 28e. What then appears on the display monitor 32 is the stored image of one surface, the non-movable surface, superimposed on the live image of the other surface, the movable surface. Depending on the position of the SPLIT FIELD switch 28f, superimposed images from both objectives 16 and 18 are simultaneously displayed, or the image from only one objective is displayed.

(STEP E) The "live" moveable surface is then manipulated by the user through system controls (not shown) connected to an x-y-z positioning stage 44 of the mask aligner system 1 until the image of the "live" surface appears to be correctly aligned to the stored image of the non-movable surface. Typically, both are considered to be aligned when the user aligns target patterns provided upon the photomask 10 and the substrate 12.

(STEP F) If at any time the user suspects that the microscope 14 has been mechanically disturbed or has drifted, the GRAB IMAGE switch 28h can be activated to store and display a "fresh" image of the non-movable surface.

Although described in the presently preferred context of a mask alignment system it should be apparent that the teaching of the invention is applicable to other applications wherein it is desired to obtain a specific orientation between two surfaces that are displaced from one another. Also, the teaching of the invention is applicable to systems having a single-field, as opposed to a splitfield, microscope system.

Thus, while the invention has been particularly shown and described with respect to a preferred embodiment thereof, it will be understood by those skilled in the art that changes in form and details may be made therein without departing from the scope and spirit of the invention.

What is claimed is:

1. Imaging apparatus comprising:
   means for generating and for storing image data, said generating and storing means including imaging means having a focal position that is adjustable between at least a first focal position and a second focal position;
   means, having an output coupled to said imaging means, for use by a user of the system for specifying a location of the first focal position and for specifying a location of the second focal position, said specifying means outputting to said imaging means, at any given time, either a specification of the location of the first focal position or a specification of the location of the second focal position; and
   control means, coupled to said specifying means and to said generating and storing means, and responsive to an input from the user of the system, for causing said specifying means to change, for a predetermined interval of time, from specifying the location of one of said first or said second focal positions to specifying the location of the other one of said focal positions, for causing said generating and storing means to store, during the predetermined interval of time, image data generated at the location of the other one of the focal positions, and for causing said generating and storing means to superimpose, after an expiration of the predetermined interval of time, the stored image data upon image data being generated at the originally specified one of the first or the second focal positions.

2. Imaging apparatus as set forth in claim 1 wherein said imaging means includes a splitfield microscope having a first microscope objective and a second microscope objective, and wherein said specifying means specifies the location of the first focal position and the location of the second focal position separately for each of said microscope objectives.

3. Imaging apparatus as set forth in claim 1 and further including display means for displaying to the user of the system the stored image data superimposed upon the image data being generated at the originally specified one of the first or the second focal positions.

4. Imaging apparatus as set forth in claim 1 wherein a substrate is positioned at the location of the first focal position, wherein a photomask is positioned at the location of the second focal position, and wherein the system further includes means for laterally positioning the substrate with respect to the photomask.

5. Imaging apparatus as set forth in claim 1 wherein said generating and storing means includes means for compensating for a delay in reading out the stored image data so as to synchronize pixels of the stored image with pixels of the image data being generated at the originally specified one of the first or the second focal positions.

6. Imaging apparatus as set forth in claim 1 wherein said specifying means includes a plurality of potentiometers for specifying the location of the first focal position and for specifying the location of the second focal position, said specifying means including switch means coupled to outputs of said plurality of potentiometers for selecting individual ones of said potentiometers outputs for being output to said imaging means.

7. Imaging apparatus as set forth in claim 1 wherein said control means includes a plurality of pulse generating means that are responsive to the input from the user, a first one of said pulse generating means having an output coupled to said specifying means and generating a first pulse having a first pulse width equal to the predetermined interval of time, the first pulse causing said specifying means to change from specifying the location of one of said first or said second focal positions to specifying the location of the other one of said focal positions.

8. Imaging apparatus as set forth in claim 7 wherein a second one of said plurality of pulse generating means has an output for generating a second pulse having a second pulse width that is less than the first pulse width, the generation of the second pulse being initiated at the same time that the generation of the first pulse is initiated, and wherein a third one of said pulse generating means has an input coupled to said output of said second one of said pulse generating means for being triggered thereby at the expiration of the second pulse, said third pulse generating means generating at an output a pulse that is coupled to said generating and storing means for causing said generating and storing means to store, during the predetermined interval of time, the image data generated at the location of the other one of the focal positions.

9. Imaging apparatus as set forth in claim 8 wherein said predetermined interval of time is approximately one second.

10. A method for generating a focussed image, with one microscope, of two surfaces that are disposed at different distances from a microscope objective, comprising the steps of:
    focussing the microscope on a first one of the surfaces and maintaining a first electrical record of the first focus position;
    focussing the microscope on a second one of the surfaces and maintaining a second electrical record of the second focus position;
    maintaining the microscope focussed on a selected one of the first or the second surfaces, as specified by either the first electrical record or the second electrical record; and, responsive to a command from a user of the microscope,
    focussing the microscope on the other one of the first or the second surfaces, as specified by the other electrical record;
    storing an image obtained by the microscope of the other one of the first or the second surfaces;
    refocussing the microscope on the selected one of the first or the second surfaces, as specified by either the first electrical record or the second electrical record; and
    displaying to the user of the microscope a current image obtained by the microscope of the selected one of the first or the second surfaces while simultaneously displaying, on the same display means, the stored image superimposed upon the current image.

11. A method as set forth in claim 10 wherein the step of displaying includes a step of reading out the stored image and a step of synchronizing pixels of the read-out image to pixels of the current image.

12. A proximity mask alignment system, comprising:
    a splitfield microscope having a first microscope objective and a second microscope objective;

means for use by an operator of the system for specifying a location of a first focal position and a location of a second focal position for said first microscope objective and for said second microscope objective, said specifying means outputting to said splitfield microscope, at any given time, either a specification of the location of the first focal position or a specification of the location of the second focal position;

means, coupled to said splitfield microscope, for generating and for storing image data representing an image viewed by said splitfield microscope;

display means, having an input coupled to an output of said generating and storing means, for displaying to the operator an image corresponding to the image viewed by said splitfield microscope; and control means, coupled to said specifying means and to said generating and storing means, and responsive to an input from the operator of the system, for causing said specifying means to change, for a predetermined interval of time, from specifying the location of one of said first or said second focal positions to specifying the location of the other one of said focal positions, for causing said generating and storing means to store, during the predetermined interval of time, image data generated at the location of the other one of the focal positions, and for causing said generating and storing means to superimpose, after an expiration of the predetermined interval of time, the stored image data upon image data being generated at the originally specified one of the first or the second focal positions.

13. A system as set forth in claim 12 wherein a substrate is positioned at the location of the first focal position, wherein a photomask is positioned at the location of the second focal position, and wherein the system further includes means for laterally positioning the substrate with respect to the photomask.

14. A system as set forth in claim 12 wherein said generating and storing means includes means for compensating for a delay in reading out the stored image data so as to synchronize pixels of the stored image with pixels of the image data being generated at the originally specified one of the first or the second focal positions.

15. A system as set forth in claim 12 wherein a photomask is positioned at the location of the first focal position, wherein a substrate is positioned at the location of the second focal position, and wherein the system further includes means for laterally positioning the photomask with respect to the substrate.

16. A system as set forth in claim 12 wherein said specifying means includes a plurality of potentiometers for specifying the location of the first focal position and for specifying the location of the second focal position, said specifying means including switch means coupled to outputs of said plurality of potentiometers for selecting individuals ones of said potentiometers outputs for being output to said splitfield microscope.

17. A system as set forth in claim 16 and further including servo control means interposed between said specifying means and said splitfield microscope, said servo control means being responsive to the outputs of said plurality of potentiometers for generating servomotor drive signals for driving servomotors coupled to said first and to said second microscope objectives.

18. A system as set forth in claim 12 wherein said control means includes a plurality of pulse generating means, a first one of said pulse generating means having an output coupled to said specifying means and generating a first pulse having a first pulse width equal to the predetermined interval of time for causing said specifying means to change from specifying the location of one of said first or said second focal positions to specifying the location of the other one of said focal positions.

19. A system as set forth in claim 18 wherein a second one of said plurality of pulse generating means has an input coupled to an input of said first one of said pulse generating means for being triggered in synchronism with said first pulse generating means by the input from the operator, by the generation of said first pulse, said second one of said pulse generating means generating at an output a second pulse having a second pulse width that is less than the first pulse width, and wherein a third one of said pulse generating means has an input coupled to said output of said second one of said pulse generating means for being triggered thereby at the expiration of the second pulse, said third pulse generating means generating at an output a pulse that is coupled to said generating and storing means for causing said generating and storing means to store, during the predetermined interval of time, the image data generated at the location of the other one of the focal positions.

20. A system as set forth in claim 19 wherein said predetermined interval of time is approximately one second.

21. An microscopy system, comprising:

a microscope having at least one microscope objective;

means for specifying a first focal position and a second focal position for said at least one microscope objective, said specifying means selectively outputting to said microscope either a specification of the first focal position or a specification of the second focal position, said microscope being responsive to the specification for moving said at least one objective to the specified focal position;

means, coupled to said microscope, for generating and for storing image data representing an image viewed by said microscope through said at least one microscope objective; and control means, coupled to said specifying means and to said generating and storing means and responsive to a triggering input signal, for causing said specifying means to change, for an interval of time, from a first specification that specifies one of said first or said second focal positions to a second specification that specifies the other one of said focal positions, for causing said generating and storing means to store, during the interval of time, image data that is generated at the focal position specified by the second specification, for causing, at the expiration of the interval of time, said specifying means to change back to specifying the first specification, and for causing said generating and storing means to combine, after the expiration of the interval of time, the stored image data with image data that is generated at the focal position specified by the first specification; and display means, having an input coupled to an output of said generating and storing means, for displaying an image corresponding to the image data, where said display means is responsive to the combined image data to display an image wherein the stored image data is superimposed with the image data that is generated at the focal position specified by the first specification.

22. A system as set forth in claim 21 wherein a substrate is positioned at a location coincident with the first focal position, wherein a photomask is positioned at a location coincident with the second focal position, and wherein the system further includes means, responsive to input from an operator, for positioning the substrate with respect to the photomask.

23. A system as set forth in claim 21 wherein a photomask is positioned at a location coincident with the first focal position, wherein a substrate is positioned at a location coincident with the second focal position, and wherein the system further includes means, responsive to input from an operator, for positioning the photomask with respect to the substrate.

* * * * *